US011551737B2

(12) United States Patent
Hase et al.

(10) Patent No.: US 11,551,737 B2
(45) Date of Patent: Jan. 10, 2023

(54) MAGNETIC STORAGE ELEMENT AND ELECTRONIC APPARATUS

(71) Applicant: SONY SEMICONDUCTOR SOLUTIONS CORPORATION, Kanagawa (JP)

(72) Inventors: Naoki Hase, Tokyo (JP); Masanori Hosomi, Tokyo (JP); Yutaka Higo, Kanagawa (JP); Hiroyuki Ohmori, Kanagawa (JP); Hiroyuki Uchida, Kanagawa (JP); Yo Sato, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 30 days.

(21) Appl. No.: 16/497,065

(22) PCT Filed: Jan. 15, 2018

(86) PCT No.: PCT/JP2018/000814
§ 371 (c)(1),
(2) Date: Sep. 24, 2019

(87) PCT Pub. No.: WO2018/185991
PCT Pub. Date: Oct. 11, 2018

(65) Prior Publication Data
US 2020/0381033 A1    Dec. 3, 2020

(30) Foreign Application Priority Data
Apr. 3, 2017  (JP) .............................. JP2017-073545

(51) Int. Cl.
*G11C 11/16*  (2006.01)
*G01R 33/09*  (2006.01)
(Continued)

(52) U.S. Cl.
CPC ........ *G11C 11/1675* (2013.01); *G01R 33/093* (2013.01); *G11C 11/161* (2013.01);
(Continued)

(58) Field of Classification Search
USPC ......................................................... 257/421
See application file for complete search history.

(56) References Cited

U.S. PATENT DOCUMENTS 9,218,864 B1 * 12/2015 Yi ........................... H01L 43/08
2009/0079018 A1 * 3/2009 Nagase ................. G11C 11/161
                                                              257/421
(Continued)

FOREIGN PATENT DOCUMENTS

CN       103633239 A     3/2014
CN       104051611 A     9/2014
(Continued)

OTHER PUBLICATIONS

International Search Report and Written Opinion of PCT Application No. PCT/JP2018/000814, dated Feb. 27, 2018, 11 pages of ISRWO.

(Continued)

*Primary Examiner* — Mohammad M Hoque
(74) *Attorney, Agent, or Firm* — Chip Law Group

(57) ABSTRACT

A magnetic storage element and an electronic apparatus having a reduced writing current while retaining a magnetism retention property of a storage layer. The magnetic storage element includes a spin orbit layer extending in one direction, a writing line that is electrically coupled to the spin orbit layer, and allows a current to flow in an extending direction of the spin orbit layer, a tunnel junction element including a storage layer, an insulator layer, and a magnetization fixed layer that are stacked in order on the spin orbit layer, and a non-magnetic layer having a film thickness of 2

(Continued)

nm or less, and disposed at any stack position between the spin orbit layer and the insulator layer.

6 Claims, 4 Drawing Sheets

(51) Int. Cl.
    *H01L 27/22*      (2006.01)
    *H01L 43/02*      (2006.01)
    *H01L 43/08*      (2006.01)
    *H01L 43/10*      (2006.01)
    *H01L 43/12*      (2006.01)

(52) U.S. Cl.
    CPC ............ *H01L 27/228* (2013.01); *H01L 43/02* (2013.01); *H01L 43/08* (2013.01); *H01L 43/10* (2013.01); *H01L 43/12* (2013.01)

(56) References Cited

U.S. PATENT DOCUMENTS

| | | |
|---|---|---|
| 2014/0056060 A1 | 2/2014 | Khvalkovskiy et al. |
| 2014/0056061 A1 | 2/2014 | Khvalkovskiy et al. |
| 2014/0124882 A1 | 5/2014 | Khalili et al. |
| 2014/0264671 A1* | 9/2014 | Chepulskyy .......... G11C 11/161 257/421 |
| 2014/0312441 A1* | 10/2014 | Guo ...................... H01L 27/228 257/427 |
| 2017/0069365 A1* | 3/2017 | Buhrman ................ H01L 43/10 |
| 2017/0076769 A1* | 3/2017 | Shirotori ................ H01L 43/02 |
| 2017/0077177 A1* | 3/2017 | Shimomura ........ G11C 11/1675 |
| 2017/0179379 A1* | 6/2017 | Shirotori ............ G11C 11/1659 |

FOREIGN PATENT DOCUMENTS

| | | | | |
|---|---|---|---|---|
| CN | 204481053 U | * | 7/2015 | |
| CN | 204516804 U | * | 7/2015 | |
| CN | 108807662 A | * | 11/2018 | ............ H01L 43/08 |
| DE | 102013109012 A1 | | 3/2014 | |
| JP | 3586870 B2 | * | 11/2004 | |
| JP | 2006-032915 A | | 2/2006 | |
| JP | 2012099699 A | * | 5/2012 | |
| JP | 2013533636 A | | 8/2013 | |
| JP | 2014-045196 A | | 3/2014 | |
| JP | 6083163 B2 | * | 2/2017 | ................ G11B 5/65 |
| JP | 2017-059594 A | | 3/2017 | |
| JP | 2017-059679 A | | 3/2017 | |
| JP | 6089081 B1 | | 3/2017 | |
| JP | 201759679 A | | 3/2017 | |

OTHER PUBLICATIONS

Office Action for JP Patent Application No. 2019-511067, dated Sep. 28, 2021, 04 pages of English Translation and 04 pages of Office Action.

* cited by examiner

[FIG. 1]
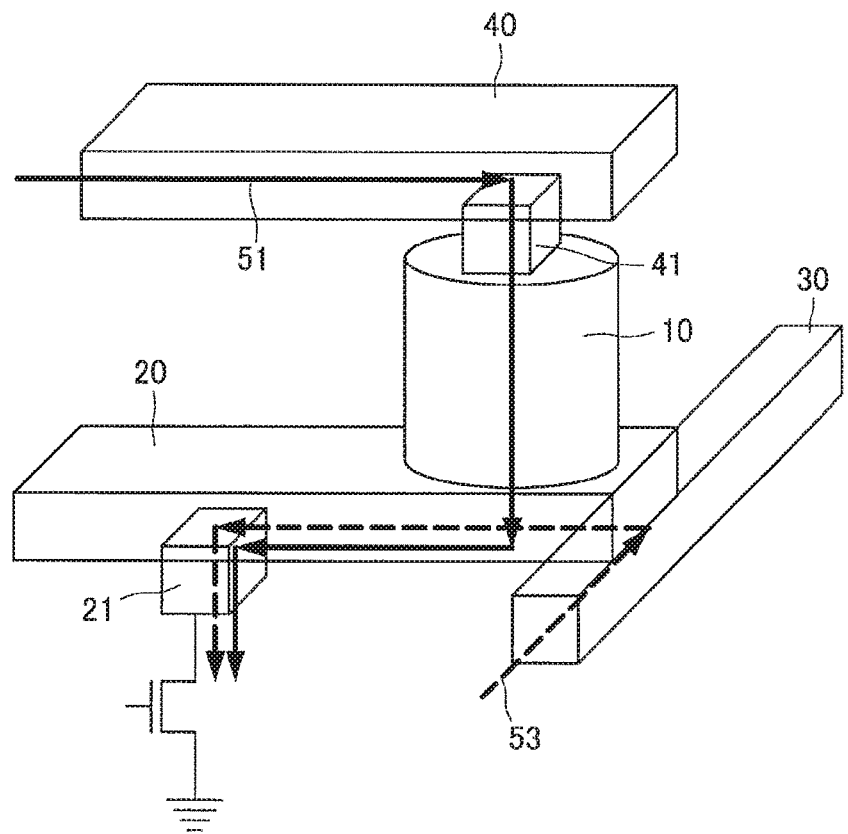
[FIG. 2]
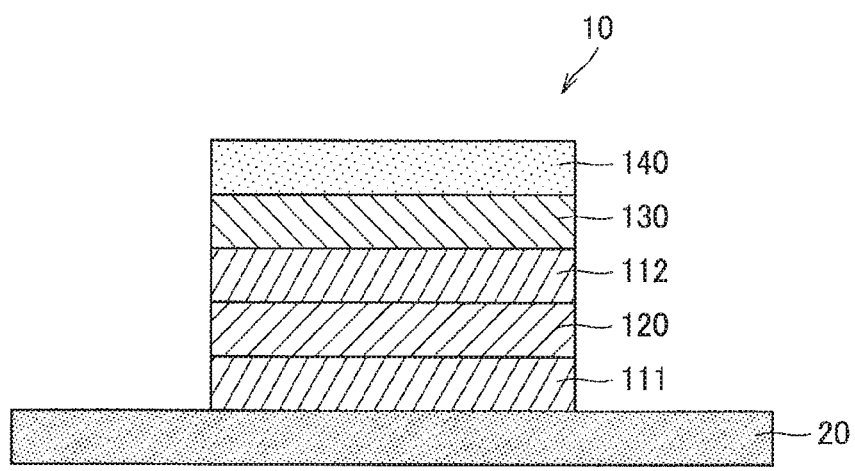

[FIG. 3]
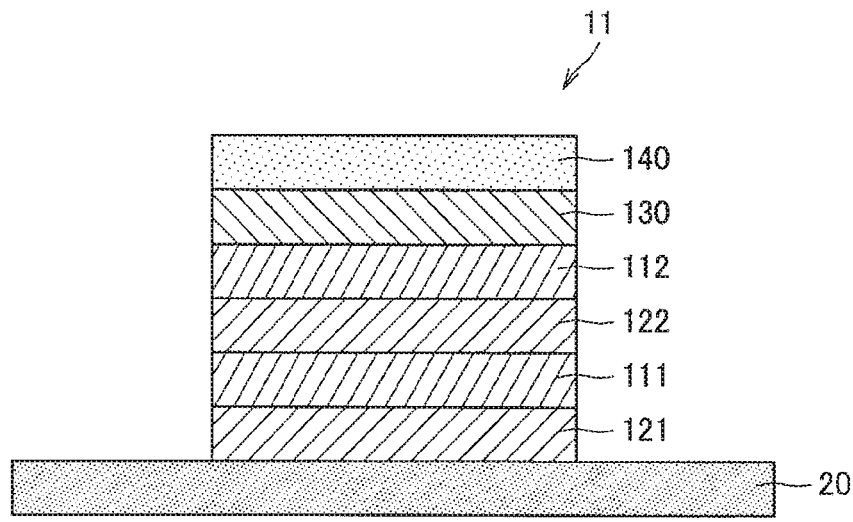
[FIG. 4]
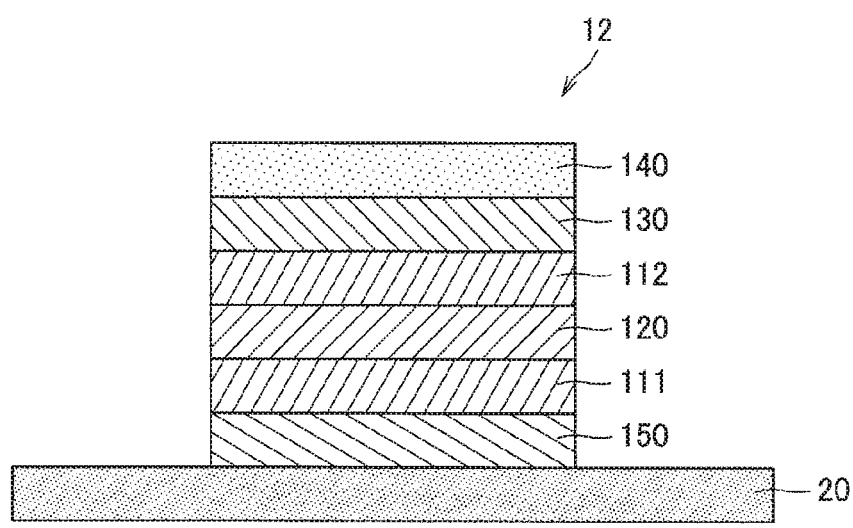
[FIG. 5]
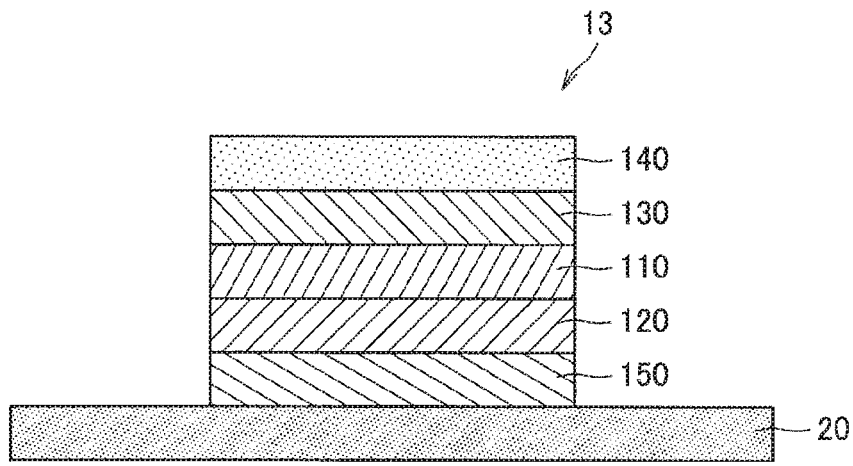

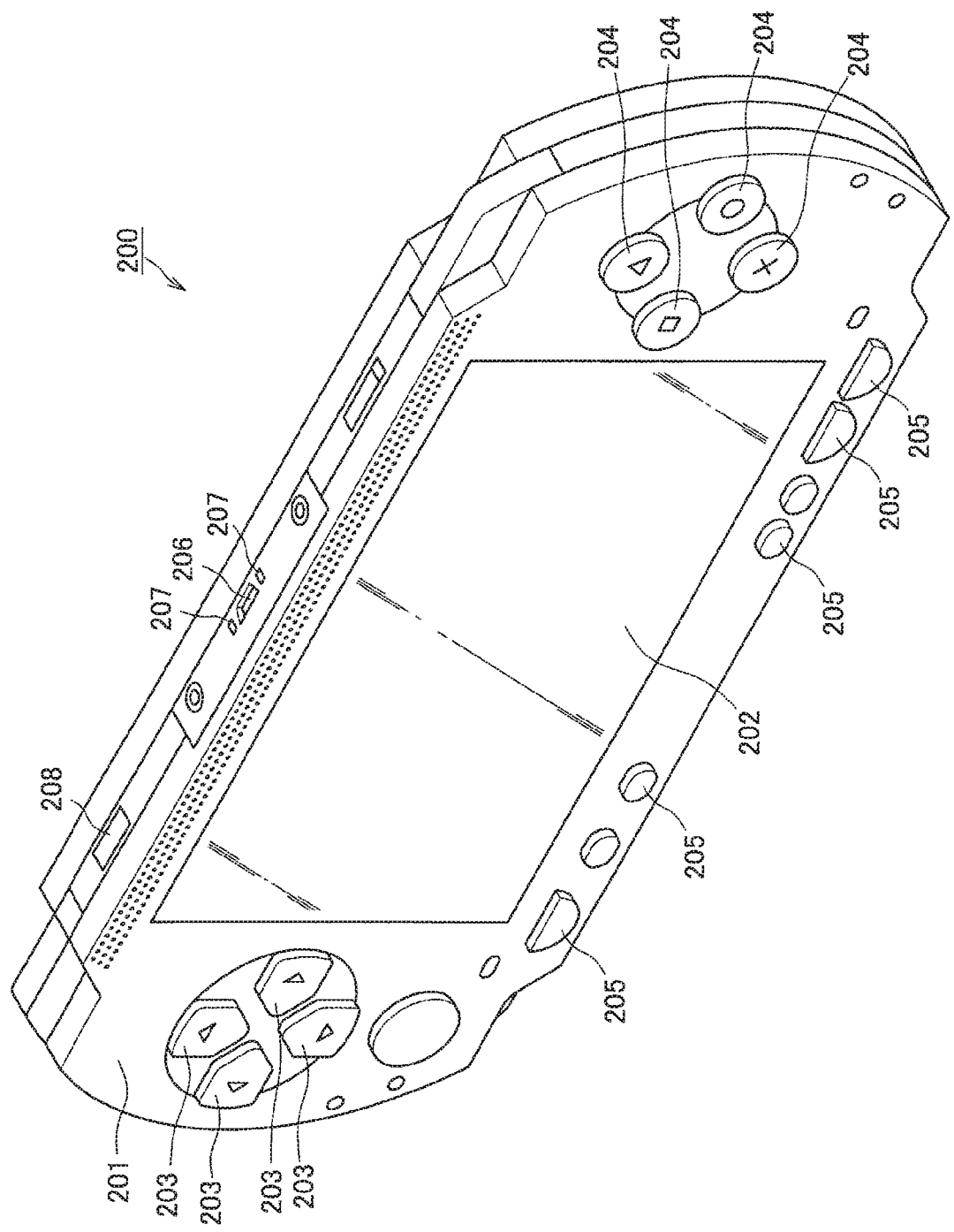
[FIG. 6]

[FIG. 7]
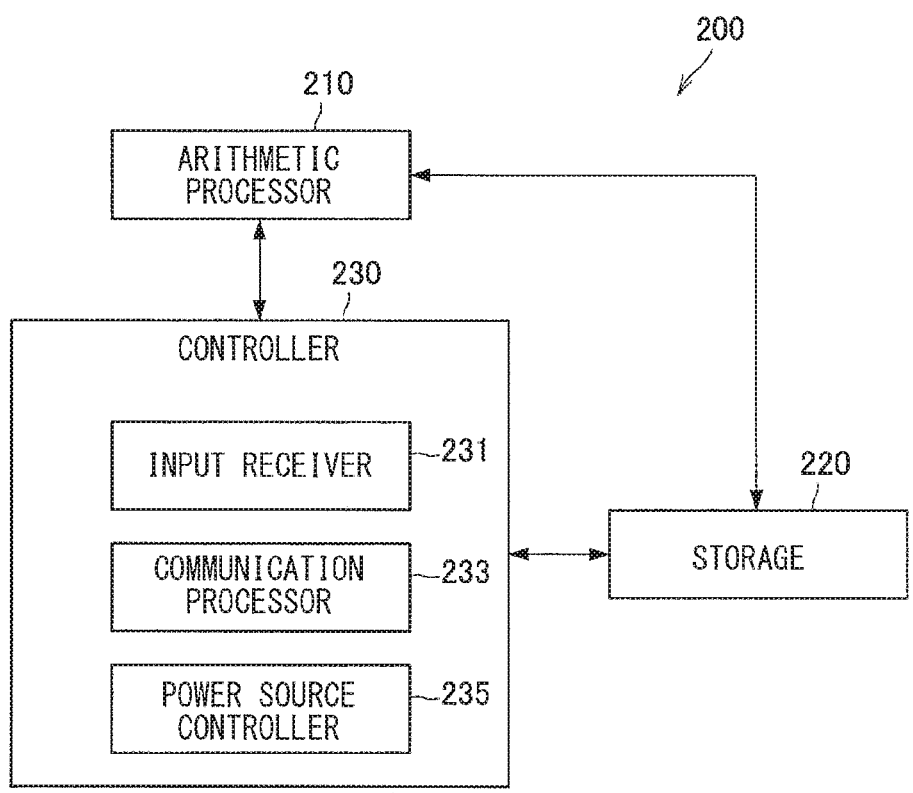

MAGNETIC STORAGE ELEMENT AND ELECTRONIC APPARATUS

CROSS REFERENCE TO RELATED APPLICATIONS

This application is a U.S. National Phase of International Patent Application No. PCT/JP2018/000814 filed on Jan. 15, 2018, which claims priority benefit of Japanese Patent Application No. JP 2017-073545 filed in the Japan Patent Office on Apr. 3, 2017. Each of the above-referenced applications is hereby incorporated herein by reference in its entirety.

TECHNICAL FIELD

The present disclosure relates to a magnetic storage element and an electronic apparatus.

BACKGROUND ART

With recent improvement in performance of various information apparatuses, storage devices built in the various information apparatuses also present an increase in degree of integration, an increasing speed, and a decrease in power consumption. Accordingly, performance of a storage element using a semiconductor is also improving.

For example, a flash memory is becoming more popular as a large capacity file memory instead of a hard disk drive device. Moreover, various types of storage elements such as FeRAM (Ferroelectric Random Access Memory), PCRAM (Phase-Change Random Access Memory), or MRAM (Magnetic Random Access Memory) are being developed as a code storage or a working memory, instead of a NOR-type flash memory and DRAM (Dynamic Random Access Memory).

For example, the MRAM that stores information therein on the basis of a magnetization direction of a magnetic body attracts attention as a storage element for the code storage or the working memory. This is because the MRAM allows for a high-speed operation and allows for substantially infinite times of rewriting as well.

Specifically, STT-MRAM (Spin Transfer Torque-Magnetic Random Access Memory) attracts attention as the MRAM. The STT-MRAM causes a magnetization reversal by using a spin-torque magnetization reversal and injecting spin-polarized electrons to an MTJ (Magnetic Tunnel Junction) element.

In fact, however, because amounts of current used for writing and reading of information are close to each other in the STT-MRAM, there has been a possibility of causing a read disturbance in which stored information is rewritten when reading out the information.

To address this, SOT-MRAM (Spin Orbit Torque-Magnetic Random Access Memory) is under consideration. Upon writing information, the SOT-MRAM reverses a magnetization direction of a storage layer using spin orbit torque that is derived from a spin polarization induced when a current is caused to flow to a metal layer disposed in contact with the storage layer.

For example, PTL 1 described below discloses a magnetic memory that reverses the magnetization direction of the storage layer using spin orbit interaction.

CITATION LIST

Patent Literature

PTL 1: Japanese Unexamined Patent Application Publication No. 2014-045196

SUMMARY OF THE INVENTION

Problems to be Solved by the Invention

However, a magnetic memory disclosed in the above-described PTL 1 involves a large amount of current used for writing information into a storage layer. On the other hand, when reducing the volume of the storage layer so as to reduce the writing current supplied to the storage layer, a magnetism retention property of the storage layer is lowered. It is thus difficult for the magnetic memory disclosed in the above-described PTL 1 to balance the reduction of the writing current and the magnetism retention property of the storage layer.

Therefore, the present disclosure proposes novel and improved magnetic storage element and electronic apparatus that are able to reduce a writing current while retaining a magnetism retention property of a storage layer in SOT-MRAM.

Means for Solving the Problems

According to the present disclosure, there is provided a magnetic storage element that includes: a spin orbit layer extending in one direction; a writing line that is electrically coupled to the spin orbit layer, and allows a current to flow in an extending direction of the spin orbit layer; a tunnel junction element including a storage layer, an insulator layer, and a magnetization fixed layer that are stacked in order on the spin orbit layer; and a non-magnetic layer having a film thickness of 2 nm or less, and disposed at any stack position between the spin orbit layer and the insulator layer.

Moreover, according to the present disclosure, there is provided an electronic apparatus including: a storage that uses a magnetic storage element; and an arithmetic processor that processes information on a basis of information stored in the storage, in which the magnetic storage element includes a spin orbit layer extending in one direction, a writing line that is electrically coupled to the spin orbit layer, and allows a current to flow in an extending direction of the spin orbit layer, a tunnel junction element including a storage layer, an insulator layer, and a magnetization fixed layer that are stacked in order on the spin orbit layer, and a non-magnetic layer having a film thickness of 2 nm or less, and disposed at any stack position between the spin orbit layer and the insulator layer.

In the present disclosure, the non-magnetic layer is able to reflect up-spin or down-spin, making it possible to improve an efficiency of reversal of a magnetization direction of the storage layer by spin-polarized electrons.

Effects of the Invention

As described above, the present disclosure makes it possible to provide the magnetic storage element and the electronic apparatus that are able to reduce a writing current while retaining a magnetism retention property of the storage layer.

It is to be noted that the above-described effects are not necessarily limiting. In addition to or instead of the above-described effects, there may be any of effects set forth herein or any other effect appreciated from the present specification.

BRIEF DESCRIPTION OF DRAWINGS

FIG. 1 is an explanatory diagram schematically illustrating a structure of SOT-MRAM.

FIG. 2 is a schematic cross-sectional view of a magnetic storage element according to a first configuration.

FIG. 3 is a schematic cross-sectional view of a magnetic storage element according to a second configuration.

FIG. 4 is a schematic cross-sectional view of a magnetic storage element according to a third configuration.

FIG. 5 is a schematic cross-sectional view of a magnetic storage element according to a fourth configuration.

FIG. 6 is a perspective view of an example appearance of an electronic apparatus.

FIG. 7 is a block diagram illustrating an internal configuration of the electronic apparatus.

MODES FOR CARRYING OUT THE INVENTION

In the following, preferred embodiments of the present disclosure are described in detail with reference to the drawings. It is to be noted that, in this specification and drawings, components having substantially the same functional configuration are denoted with the same reference numerals, and description thereof are thereby omitted. Moreover, in this specification, a direction of stack of each layer is expressed as an upward direction It is to be noted that the description is made in the following order.
1. Outline of SOT-MRAM
   1.1. Technical Background Related to Present Disclosure
   1.2. Structure of SOT-MRAM
   1.3. Operation of SOT-MRAM
2. Regarding One Embodiment of Present Disclosure
   2.1 First Configuration
   2.2 Second Configuration
   2.3 Third Configuration
   2.4 Fourth Configuration
3. Configuration of Electronic apparatus

1. Outline of SOT-MRAM

1.1. Technical Background Related to Present Disclosure

As represented by a flash memory, non-volatile semiconductor storage elements are being developed with such momentum as to drive away storage devices other than semiconductor storage elements, such as an HDD (Hard Disk Drive) device, presenting remarkable advancement. Moreover, besides a data storage, a storage device including a non-volatile semiconductor storage element is considered to be developed into: a code storage that stores therein a program, an arithmetic, and the like; and a working memory that temporarily stores therein parameters or the like that may change on an as-necessary basis upon execution of the program.

Specific examples of the non-volatile semiconductor storage element may include, for example, a NOR-type flash memory and a NAND-type flash memory. Moreover, in addition thereto, FeRAM that stores information therein on the basis of a residual polarization of a ferroelectric substance, PCRAM that stores information therein on the basis of a phase state of a phase change film, MRAM that stores information therein on the basis of a magnetization direction of a magnetic body, and the like are additionally under consideration as the non-volatile semiconductor storage element.

In particular, the MRAM stores information therein on the basis of the magnetization direction of the magnetic body, allowing for rewriting of information at high speed and substantially infinitely. The MRAM is therefore being actively developed, which is now partially put into practical use in the fields of industrial automation equipment and aircrafts.

Now, several methods are considered for the MRAM depending on a method of writing information into the storage layer.

For example, there is proposed MRAM that reverses the magnetization direction of the magnetic body in a current magnetic field generated from a wiring line. Such MRAM, however, requires a current on the order of several mA for generating a current magnetic field that is strong enough to reverse the magnetization direction of the magnetic body, and is thus involves a difficulty in reducing power consumption. Moreover, such MRAM requires the wiring line for generating the current magnetic field for each of the magnetic storage elements, and is thus involves a difficulty in achieving a size reduction.

For example, there is proposed STT-MRAM that uses a spin-torque magnetization reversal and injects spin-polarized electrons by causing a current to flow to an MTJ element to thereby causes a magnetization reversal. However, the STT-MRAM is low in reliability as a storage element, because amounts of current used for writing and reading of information are close to each other and there is thus a possibility of causing a read disturbance in which stored information is rewritten when reading out the information.

Therefore, SOT-MRAM (Spin Orbit Torque-Magnetic Random Access Memory) is under consideration as the MRAM that solves the problems associated with the above-described writing method. The SOT-MRAM reverses a magnetic property of the magnetic body by using spin orbit torque.

1.2. Structure of SOT-MRAM

First, a basic structure of the SOT-MRAM is described with reference to FIG. 1. FIG. 1 is an explanatory diagram schematically illustrating the structure of the SOT-MRAM.

As illustrated in FIG. 1, the SOT-MRAM includes a spin orbit layer 20 extending in one direction, a writing line 30 electrically coupled to the spin orbit layer 20, and a tunnel junction element 10 disposed on the spin orbit layer 20. Moreover, a reading line 40 is coupled to the tunnel junction element 10 via an electrode 41 on a surface. The surface faces a surface that is in contact with the spin orbit layer 20. A select transistor is coupled to the spin orbit layer 20 via an electrode 21.

The spin orbit layer 20 extends in one direction, and generates spin-polarized electrons by causing electrons that pass through the spin orbit layer 20 to be subjected to a spin polarization. Specifically, it is possible to form the spin orbit layer 20 using a sufficiently thin electrically-conductive material. In such a spin orbit layer 20, electrons are polarized into different directions between above and below the spin orbit layer 20 while the electrons pass through the spin orbit layer 20. The spin orbit layer 20 injects the spin-polarized electrons having undergone the spin-polarization into the storage layer of the tunnel junction element 10 to apply spin torque to a magnetic moment of the storage layer, thereby reversing a magnetization direction of the storage layer.

The writing line 30 is electrically coupled to the spin orbit layer 20, and allows a current to flow in the extending direction of the spin orbit layer 20 when writing information into the tunnel junction element 10. For example, the writing line 30 may be coupled to the spin orbit layer 20 and disposed in the same plane as the spin orbit layer 20. The writing line 30 may include an electrically conductive material typically used for a wiring line or an electrode, and may include, for example, a metal such as Cu, Ag, Au, Pt, Ti, W, or Al, or an alloy containing such metals.

The tunnel junction element 10 has a structure in which an insulator layer on the order of several nm is sandwiched by two ferromagnetic body layers, and is disposed on the spin orbit layer 20. Specifically, the tunnel junction element 10 has a structure in which the storage layer having a variable magnetization direction, the insulator layer on the order of several nm, and a magnetization fixed layer having a fixed magnetization direction are stacked in order from a side in contact with the spin orbit layer 20. That is, the tunnel junction element 10 may be a so-called MTJ element.

The tunnel junction element 10 is able to apply a tunnel current to the insulator layer by a tunnel magnetoresistive effect when a voltage is applied between the storage layer and the magnetization fixed layer. At this time, an electrical resistance of the insulator layer changes depending on whether the respective magnetization directions of the storage layer and the magnetization fixed layer are parallel or antiparallel to each other. Moreover, because the magnetization direction of the storage layer in contact with the spin orbit layer 20 is controllable by the spin-polarized electrons injected from the spin orbit layer 20, the tunnel junction element 10 is able to store information therein on the basis of a relative angle between the magnetization direction of the storage layer and the magnetization direction of the magnetization fixed layer.

The reading line 40 is electrically coupled to the tunnel junction element 10, and allows a current to flow to the tunnel junction element 10 when reading information from the tunnel junction element 10. For example, the reading line 40 may be electrically coupled to the magnetization fixed layer of the tunnel junction element 10 via the electrode 41. The reading line 40 may include an electrically conductive material typically used for a wiring line or an electrode, and may include, for example, a metal such as Cu, Ag, Au, Pt, Ti, W, or Al, or an alloy containing such metals.

The electrode 41 electrically couples the tunnel junction element 10 to the reading line 40. The electrode 41 may include, for example, an electrically conductive material typically used for a wiring line or an electrode similar to that of the writing line 30 or the reading line 40.

The electrode 21 electrically couples the spin orbit layer 20 to the select transistor. Switching the select transistor that is electrically coupled by the electrode 21 determines selection or non-selection of the tunnel junction element 10 at the time of writing and reading information. The electrode 21 may include, for example, an electrically conductive material typically used for a wiring line or an electrode similar to that of the writing line 30 or the reading line 40.

1.3. Operation of SOT-MRAM

Subsequently, detailed description is given of operations of writing information to and reading information from the above-described SOT-MRAM.

As illustrated in FIG. 1, when writing information to the SOT-MRAM, a current flows in a direction indicated by an arrow 53. Specifically, the current so flows from the writing line 30 to the spin orbit layer 20 as to pass below the tunnel junction element 10. It is to be noted that the current having flown through the spin orbit layer 20 flows to a ground via the electrode 21.

The electrons having passed through the spin orbit layer 20 are polarized into different spin directions between above and below the spin orbit layer 20. This allows the spin-polarized electrons polarized above the spin orbit layer 20 to be injected into the storage layer of the tunnel junction element 10. Accordingly, in the storage layer, in a case where the magnetic moment of the storage layer receives the spin torque from the spin-polarized electrons and the spin torque received from the spin-polarized electrons exceeds a threshold, the magnetic moment of the storage layer starts a precessional motion and is reversed. In this manner, the SOT-MRAM reverses the magnetization direction of the storage layer of the tunnel junction element 10 by the spin orbit interaction between the spin orbit layer 20 and the storage layer of the tunnel junction element 10, thereby writing information into the storage layer.

Moreover, as illustrated in FIG. 1, when reading out information from the SOT-MRAM, a current flows in a direction indicated by an arrow 51. Specifically, the current flows from the reading line 40 and passes through the tunnel junction element 10 to flow to the spin orbit layer 20. It is to be noted that the current having flown through the spin orbit layer 20 flows to the ground via the electrode 21.

In the tunnel junction element 10, the electrical resistance of the insulator layer is changed by the tunnel magnetoresistive effect on the basis of whether the magnetization directions of the magnetization fixed layer and the storage layer that interpose the insulator layer are parallel or antiparallel. Accordingly, the SOT-MRAM makes it possible to detect the magnetization direction of the storage layer of the tunnel junction element 10 by measuring the electrical resistance of the tunnel junction element 10. In this manner, the SOT-MRAM detects the magnetization direction of the storage layer of the tunnel junction element 10 by detecting the electrical resistance of the tunnel junction element 10, thereby reading information from the storage layer.

Accordingly, such writing and reading operations allow the SOT-MRAM to store information therein on the basis of the magnetization direction of the storage layer of the tunnel junction element 10.

In the SOT-MRAM, when writing information into the storage layer, the current does not flow to the tunnel junction element 10 but the current flows to the spin orbit layer 20 that is in contact with the storage layer of the tunnel junction element 10. Thus, in the SOT-MRAM, electric conduction does not break the insulator layer when writing information. Moreover, in the SOT-MRAM, because a current path in a case of writing information into the storage layer and a current path in a case of reading out information from the storage layer are different from each other, it is possible to prevent the read disturbance in which the stored information is rewritten when reading out the information. Hence, the SOT-MRAM makes it possible to further improve reliability of the magnetic storage element.

Here, a current density $J_c$ required for reversing the magnetization direction of the storage layer of the SOT-MRAM is expressed by the following Expression 1.

[Expression 1]

$$J_c = (A \cdot Ms \cdot t_F / \theta_{SH})(HK/2 - H_{ex}/\sqrt{2}) \quad \text{Expression 1}$$

In the above-described Expression 1, A is a constant, Ms is a saturation magnetization, $t_F$ is a film thickness of the storage layer, $\theta_{SH}$ is a spin hall angle that represents an efficiency of converting the current, having flown to the spin orbit layer 20, into a spin current that is the basis of the spin orbit torque, Hk is an effective anisotropy magnetic field of the storage layer, and $H_{ex}$ is an external magnetic field.

In order to further reduce the power consumption of the magnetic storage element, it is desirable that the current density $J_c$ be reduced. However, because a magnetism retention property of the storage layer is proportional to "Hk× Ms×volume of the storage layer" (i.e. planar area of the storage layer×$t_F$), increasing the magnetism retention property of the storage layer also increases the current density $J_c$ required for reversing the magnetization direction of the storage layer, as can be seen from the Expression 1. Therefore, it has been difficult for the SOT-MRAM described above to reduce the writing current to the storage layer while retaining the magnetism retention property of the storage layer.

The present inventors have arrived at a technique according to the present disclosure as a result of intensive studies on the above-described problem, etc. The magnetic storage element according to one embodiment of the present disclosure includes a non-magnetic layer that has a film thickness of 2 nm or less and that is inserted at any stack position between the spin orbit layer and the insulator layer of the SOT-MRAM. Accordingly, the magnetic storage element according to the present embodiment makes it possible to reduce the writing current while retaining the magnetism retention property of the storage layer, by improving an efficiency of the reversal of the magnetization direction of the storage layer by the spin-polarized electrons. In the following, such a magnetic storage element according to the present embodiment is described in detail.

2. One Embodiment of Present Disclosure

2.1. First Configuration

First, a first configuration of the magnetic storage element according to the present embodiment is described with reference to FIG. 2. FIG. 2 is a schematic cross-sectional view of the magnetic storage element according to the first configuration.

As illustrated in FIG. 2, the magnetic storage element according to the first configuration includes the spin orbit layer 20 and the tunnel junction element 10 disposed on the spin orbit layer 20. Moreover, the tunnel junction element 10 includes a first storage layer 111 disposed on the spin orbit layer 20, a non-magnetic layer 120 disposed on the first storage layer 111, a second storage layer 112 disposed on the non-magnetic layer 120, an insulator layer 130 disposed on the second storage layer 112, and a magnetization fixed layer 140 disposed on the insulator layer 130.

The spin orbit layer 20 generates the spin-polarized electrons by causing the electrons passing through the spin orbit layer 20 to be subjected to the spin polarization, and injects the generated spin-polarized electrons into the first storage layer 111. Moreover, the spin orbit layer 20 reverses the magnetization direction of the first storage layer 111 by applying the spin torque to the magnetic moment of the first storage layer 111 using the injected spin-polarized electrons.

The spin orbit layer 20 is formable by an electrically conductive material that is thin enough for the passing electrons to cause the spin polarization. Moreover, the spin orbit layer 20 preferably includes an electrically conductive material having a high spin polarization efficiency. For example, the spin orbit layer 20 preferably includes at least one electrically conductive material selected from the group consisting of Al, Ti, V, Cr, Mn, Cu, Zn, Ag, Hf, Ta, W, Re, Pt, Au, Hg, Pb, Bi, Si, Ga, GaMn, and GaAs. Furthermore, the spin orbit layer 20 may be further added with at least one element selected from the group consisting of Y, Zr, Nb, Mo, Tc, Ru, Rh, Pd, Cd, In, Sb, Te, Hf, Ta, W, Re, Os, Jr, Pt, Ag, Au, Hg, Tl, Pb, Bi, Po, At, V, Cr, Mn, Fe, Co, Ni, P, S, Zn, Ga, Ge, As, Se, I, Lu, La, Ce, Pr, Nd, Pm, Sm, Eu, Gd, Tb, Dy, Ho, Er, Tm, and Yb.

The first storage layer 111 and the second storage layer 112 each include a ferromagnetic material, and are disposed on the spin orbit layer 20 while interposing the non-magnetic layer 120 therebetween. Moreover, the magnetization directions of the first storage layer 111 and the second storage layer 112 are not fixed but reversible to be either parallel or antiparallel to the magnetization direction of the magnetization fixed layer 140.

Because the first storage layer 111 and the second storage layer 112 are magnetically coupled to each other via the non-magnetic layer 120, the first storage layer 111 and the second storage layer 112 are not able to reverse the magnetization direction independent of each other. That is, in a case where the magnetization direction of one of the first storage layer 111 and the second storage layer 112 is reversed, the magnetization direction of the other one of the first storage layer 111 and the second storage layer 112 is also reversed owing to the magnetic coupling. Accordingly, because the first storage layer 111, the second storage layer 112, and the non-magnetic layer 120 collectively function as if they are a single storage layer, it is possible to have a magnetization retention property similar to that of a storage layer having the same volume as the total volume of the first storage layer 111, the second storage layer 112, and the non-magnetic layer 120.

On the other hand, when writing information into the first storage layer 111 and the second storage layer 112, a threshold of the current required for reversing the magnetization directions of the first storage layer 111 and the second storage layer 112 is determined by the first storage layer 111 to which the spin-polarized electrons are injected from the spin orbit layer 20. Accordingly, a magnitude of the writing current required upon writing information into the first storage layer 111 and the second storage layer 112 is determined by the volume of the first storage layer 111. It is thus possible to reduce the magnitude of the writing current to a value that corresponds to the first storage layer 111 in the tunnel junction element 10. Thus, in the tunnel junction element 10, it is possible to increase the magnetization retention property while suppressing the writing current.

The first storage layer 111 and the second storage layer 112 each preferably include a ferromagnetic material having a composition in which a plurality of elements is combined. For example, the plurality of elements is selected from the group consisting of Co, Fe, B, Al, Si, Mn, Ga, Ge, Ni, Cr, and V. Moreover, the first storage layer 111 and the second storage layer 112 each may have a single layer, may have a stack including an insulator layer and a magnetic layer, or may have a stack including an oxide layer and a magnetic layer. Furthermore, the first storage layer 111 and the second storage layer 112 each may include the same ferromagnetic material or different ferromagnetic materials.

The non-magnetic layer 120 includes a non-magnetic material having a film thickness of 2 nm or less, and is interposed between the first storage layer 111 and the second storage layer 112. The non-magnetic layer 120 forms antiferromagnetic exchange coupling by having a three-layered stack structure including a ferromagnetic body, a non-magnetic body, and a ferromagnetic body, thereby magnetically coupling the first storage layer 111 and the second storage layer 112. It is to be noted that the film thickness of the non-magnetic layer 120 of greater than 2 nm is not preferable in that the antiferromagnetic exchange coupling is not generated between the first storage layer 111 and the second storage layer 112 and thus the first storage layer 111 and the second storage layer 112 are not magnetically coupled.

Moreover, the non-magnetic layer 120 functions as a spin reflection layer that preferentially reflects either up-spin or down-spin, thereby preventing the spin-polarized electrons, injected from the spin orbit layer 20 into the first storage layer 111, from diffusing to the second storage layer 112 side. Specifically, the non-magnetic layer 120 reflects the spin-polarized electrons, thereby making it possible to confine the spin-polarized electrons between the first storage layer 111 and the spin orbit layer 20. Thus, the non-magnetic layer 120 is able to improve the efficiency of the reversal of the magnetic direction of the first storage layer 111 by the spin-polarized electrons. It is to be noted that the film thickness of the non-magnetic layer 120 of greater than 2 nm is not preferable in that the non-magnetic layer 120 becomes difficult to function as the spin reflection layer.

The non-magnetic layer 120 is formable by a non-magnetic material. For example, it is possible to form the non-magnetic layer 120 by a single layer film that uses a material selected from the group consisting of Ru, Mo, Nb, HfB, Ta, W, Cr, MgO, $AlO_x$, MgS, and $MgCaS_2$, or by a laminated film that uses two or more thereof.

The insulator layer 130 includes an insulator material, and is interposed between the second storage layer 112 and the magnetization fixed layer 140. The insulator layer 130 is interposed between the second storage layer 112 and the magnetization fixed layer 140, thereby functioning as a tunnel junction element that achieves the tunnel magnetoresistive effect.

The insulator layer 130 is formable by using various insulators, dielectrics, or semiconductors, such as MgO, $Al_2O_3$, AlN, $SiO_2$, $Bi_2O_3$, $MgF_2$, CaF, $SrTiO_2$, $AlLaO_3$, or Al—N—O. Moreover, forming the insulator layer 130 using MgO is more preferable in that it is possible to make a magnetic resistance changing rate (i.e. MR ratio) of the tunnel junction element 10 higher.

The magnetization fixed layer 140 includes a ferromagnetic material and is disposed on the insulator layer 130. The magnetization direction of the magnetization fixed layer 140 is fixed in a predetermined direction on the basis of, as a reference, the magnetization directions of the first storage layer 111 and the second storage layer 112. The magnetization fixed layer 140 preferably includes a ferromagnetic material in which magnetization direction is difficult to change, because the magnetization fixed layer 140 serves as a reference for information to be stored in the tunnel junction element 10. For example, the magnetization fixed layer 140 may include a ferromagnetic material having high coercivity or a large magnetic damping constant. Moreover, the magnetization fixed layer 140 may have a large thickness to thereby make its magnetization direction difficult to be changed.

For example, the magnetization fixed layer 140 preferably includes a ferromagnetic material having a composition in which a plurality of elements is combined. The plurality of elements is selected from the group consisting of Co, Fe, B, Al, Si, Mn, Ga, Ge, Ni, Cr, and V. It is to be noted that the magnetization fixed layer 140 may have a single layer, may have a stack including an insulator layer and a magnetic layer, or may have a stack including an oxide layer and a magnetic layer.

Here, the magnetization directions of the first storage layer 111, the second storage layer 112, and the magnetization fixed layer 140 each may be a direction perpendicular to a film surface, or may be an in-plane direction with respect to the film surface. In a case where the magnetization direction is the direction perpendicular to the film surface, the magnetic storage element including the tunnel junction element 10 is able to function as perpendicular magnetization SOT-MRAM. Moreover, in a case where the magnetization direction is the in-plane direction with respect to the film surface, the magnetic storage element including the tunnel junction element 10 is able to function as in-plane magnetization SOT-MRAM.

According to the first configuration as described above, the non-magnetic layer 120 having the film thickness of 2 nm or less is provided between the spin orbit layer 20 and the insulator layer 130, and reflects the spin-polarized electrons injected from the spin orbit layer 20. Hence, it is possible to improve the efficiency of the reversal of the magnetization direction of the first storage layer 111 by the spin-polarized electrons.

Moreover, according to the first configuration, the non-magnetic layer 120 having the film thickness of 2 nm or less is provided between the first storage layer 111 and the second storage layer 112 to allow the first storage layer 111 and the second storage layer 112 to be magnetically coupled. Accordingly, it is possible to reduce an amount of current that allows for the reversal of the magnetization direction of the first storage layer 111, while improving the magnetism retention property of the first storage layer 111 and the second storage layer 112.

It is to be noted that the magnetic storage element according to the present embodiment is manufacturable using an apparatus and a condition that are used to manufacture typical semiconductors. For example, it is possible to manufacture the magnetic storage element according to the present embodiment by using a method such as a sputtering method, a CVD (Chemical Vapor Deposition) method, a photolithography method, an etching method, or a CMP (Chemical Mechanical Polish) method, on an as-necessary basis.

2.2. Second Configuration

Subsequently, a second configuration of the magnetic storage element according to the present embodiment is described with reference to FIG. 3. FIG. 3 is a schematic cross-sectional view of the magnetic storage element according to the second configuration.

As illustrated in FIG. 3, the magnetic storage element according to the second configuration includes the spin orbit layer 20 and a tunnel junction element 11 disposed on the spin orbit layer 20. Moreover, the tunnel junction element 11 includes a first non-magnetic layer 121 disposed on the spin orbit layer 20, the first storage layer 111 disposed on the first non-magnetic layer 121, a second non-magnetic layer 122 disposed on the first storage layer 111, the second storage layer 112 disposed on the second non-magnetic layer 122, the insulator layer 130 disposed on the second storage layer 112, and the magnetization fixed layer 140 disposed on the insulator layer 130.

That is, the tunnel junction element 11 according to the second configuration is different from the first configuration in that the non-magnetic layer (i.e. first non-magnetic layer 121) is provided between the first storage layer 111 and the spin orbit layer 20.

It is to be noted that the spin orbit layer 20, the first storage layer 111, the second storage layer 112, the insulator layer 130, and the magnetization fixed layer 140 are substantially similar to those in the first configuration, and therefore the description thereof is omitted here.

The first non-magnetic layer 121 includes a non-magnetic material having a film thickness of 2 nm or less and is disposed on the spin orbit layer 20. As with the non-magnetic layer 120, the first non-magnetic layer 121 functions as the spin reflection layer that preferentially reflects either up-spin or down-spin, and further reflects the spin-polarized electrons having been reflected by the second non-magnetic layer 122 toward the spin orbit layer 20. Specifically, the first non-magnetic layer 121 reflects the spin-polarized electrons, thereby making it possible to confine the spin-polarized electrons in the first storage layer 111. Thus, the first non-magnetic layer 121 is able to improve the efficiency of the reversal of the magnetic direction of the first storage layer 111. It is to be noted that the first non-magnetic layer 121 is formable by a material similar to that of the non-magnetic layer 120, for example. It is to be noted that the film thickness of the first non-magnetic layer 121 of greater than 2 nm is not preferable in that the first non-magnetic layer 121 becomes difficult to function as the spin reflection layer.

The second non-magnetic layer 122 includes a non-magnetic material having a film thickness of 2 nm or less and is interposed between the first storage layer 111 and the second storage layer 112, as with the non-magnetic layer 120. The second non-magnetic layer 122 is formed to have the film thickness of 2 nm or less and thereby reflects the spin-polarized electrons, making it possible to improve the efficiency of the reversal of the magnetization direction of the first storage layer 111 by the spin-polarized electrons. Moreover, the second non-magnetic layer 122 has the film thickness of 2 nm or less, making it possible to magnetically couple the first storage layer 111 and the second storage layer 112. Accordingly, the second non-magnetic layer 122 is able to reduce the amount of current that allows for the reversal of the magnetization direction of the first storage layer 111, while improving the magnetism retention property of the first storage layer 111 and the second storage layer 112. It is to be noted that the second non-magnetic layer 122 is formable by a material similar to that of the non-magnetic layer 120, for example.

According to the second configuration as described above, the non-magnetic layer (first non-magnetic layer 121) having the film thickness of 2 nm or less is provided between the spin orbit layer 20 and the first storage layer 111, making it possible to confine the spin-polarized electrons in the first storage layer 111. Accordingly, the tunnel junction element 11 according to the second configuration to further improve the efficiency of the reversal of the magnetization direction of the first storage layer 111 by the spin-polarized electrons.

2.3. Third Configuration

Next, a third configuration of the magnetic storage element according to the present embodiment is described with reference to FIG. 4. FIG. 4 is a schematic cross-sectional view of the magnetic storage element according to the third configuration.

As illustrated in FIG. 4, the magnetic storage element according to the third configuration includes the spin orbit layer 20 and a tunnel junction element 12 disposed on the spin orbit layer 20. Moreover, the tunnel junction element 12 includes a perpendicular assist layer 150 disposed on the spin orbit layer 20, the first storage layer 111 disposed on the perpendicular assist layer 150, the non-magnetic layer 120 disposed on the first storage layer 111, the second storage layer 112 disposed on the non-magnetic layer 120, the insulator layer 130 disposed on the second storage layer 112, and the magnetization fixed layer 140 disposed on the insulator layer 130.

That is, the tunnel junction element 12 according to the third configuration is different from the first configuration in that the perpendicular assist layer 150 is provided between the first storage layer 111 and the spin orbit layer 20.

It is to be noted that the spin orbit layer 20, the first storage layer 111, the non-magnetic layer 120, the second storage layer 112, the insulator layer 130, and the magnetization fixed layer 140 are substantially similar to those in the first configuration, and therefore the description thereof is omitted here.

The perpendicular assist layer 150 is disposed on the spin orbit layer 20 and functions as an underlayer of the first storage layer 111, thereby controlling the magnetization direction of the first storage layer 111 in the direction perpendicular to the film surface. Specifically, the perpendicular assist layer 150 includes a non-magnetic material that increases magnetic anisotropy in the direction perpendicular to the film surface of the first storage layer 111. For example, the perpendicular assist layer 150 may control the magnetization direction of the first storage layer 111 in the direction perpendicular to the film surface by controlling a crystal orientation or magnetic anisotropy of the first storage layer 111, or may control the magnetization direction of the first storage layer 111 in the direction perpendicular to the film surface by interface anisotropy. For example, the perpendicular assist layer 150 may include an oxide such as MgO or $AlO_x$, an NaCl crystal structure compound in which 3d transition metal element is added to MgO, or an NaCl crystal structure compound in which Ca or S is added to Mg.

According to the third configuration as described above, the perpendicular assist layer 150 is further provided between the spin orbit layer 20 and the first storage layer 111, making it possible to increase the perpendicular anisotropy of the magnetization direction of the first storage layer 111. Accordingly, the tunnel junction element 12 according to the third configuration is able to further improve the magnetization retention property of the first storage layer 111 and the second storage layer 112.

2.4. Fourth Configuration

Subsequently, a fourth configuration of the magnetic storage element according to the present embodiment is described with reference to FIG. 5. FIG. 5 is a schematic cross-sectional view of the magnetic storage element according to the fourth configuration.

As illustrated in FIG. 5, the magnetic storage element according to the fourth configuration includes the spin orbit layer 20 and a tunnel junction element 13 disposed on the spin orbit layer 20. Moreover, the tunnel junction element 13 includes the perpendicular assist layer 150 disposed on the spin orbit layer 20, the non-magnetic layer 120 disposed on the perpendicular assist layer 150, a storage layer 110 disposed on the non-magnetic layer 120, the insulator layer 130 disposed on the storage layer 110, and the magnetization fixed layer 140 disposed on the insulator layer 130.

That is, the tunnel junction element 13 according to the fourth configuration is different from the third configuration in that the first storage layer 111 is removed.

It is to be noted that the spin orbit layer 20, the perpendicular assist layer 150, the insulator layer 130, and the magnetization fixed layer 140 are substantially similar to those in the third configuration, and therefore the description thereof is omitted here.

The non-magnetic layer 120 includes a non-magnetic material having a film thickness of 2 nm or less and is disposed on the perpendicular assist layer 150. The non-magnetic layer 120 functions as the spin reflection layer that preferentially reflects the up-spin or the down-spin, thereby improving the efficiency of the reversal of the magnetic direction of the storage layer 110 by the spin-polarized electrons. The non-magnetic layer 120 is formable by a material similar to that of the non-magnetic layer 120 in the first configuration, for example.

It is to be noted that the perpendicular assist layer 150 includes the thin film that is equal to or less than 2 nm, making it possible to control the perpendicular anisotropy of the magnetization direction of the storage layer 110 via the non-magnetic layer 120. The film thickness of the non-magnetic layer 120 of greater than 2 nm is not preferable in that the perpendicular assist layer 150 becomes not able to control the magnetic anisotropy in the direction perpendicular to the film surface of the storage layer 110.

The storage layer 110 includes a ferromagnetic material and is disposed on the non-magnetic layer 120. The magnetization direction of the storage layer 110 is not fixed but is reversible to be either parallel or antiparallel to the magnetization direction of the magnetization fixed layer 140. Here, in the storage layer 110, the magnetic anisotropy in the direction perpendicular to the film surface is increased by the perpendicular assist layer 150 and the efficiency of the reversal of the magnetization direction is improved by the non-magnetic layer 120 as well, making it possible to reduce the writing current while improving the magnetization retention property. It is to be noted that the storage layer 110 is formable by a material similar to that of the first storage layer 111 and the second storage layer 112 in the first configuration.

According to the fourth configuration as described above, the non-magnetic layer 120 having the film thickness of 2 nm or less is provided between the spin orbit layer 20 and the insulator layer 130, making it possible to improve the efficiency of the reversal of the magnetization direction of the storage layer 110. Moreover, according to the fourth configuration, the perpendicular assist layer 150 is provided between the spin orbit layer 20 and the non-magnetic layer 120, making it possible to increase the magnetic anisotropy in the direction perpendicular to the film surface of the storage layer 110. Accordingly, the tunnel junction element 13 according to the fourth configuration is able to further improve the magnetization retention property of the storage layer 110.

3. Configuration of Electronic Apparatus

Furthermore, an electronic apparatus using the magnetic storage element according to the present embodiment is described with reference to FIGS. 6 and 7. A plurality of magnetic storage elements according to the present embodiment may be arranged in an array to configure a magnetic storage device, and the electronic apparatus may include the magnetic storage device as any of a large capacity file memory, a code storage, and a working memory, for example.

3.1. Example Appearance of Electronic Apparatus

First, an appearance of an electronic apparatus 200 using the magnetic storage element according to the present embodiment or the magnetic storage device is described with reference to FIG. 6. FIG. 6 is a perspective view of an example appearance of the electronic apparatus 200.

As illustrated in FIG. 6, the electronic apparatus 200 has an appearance with each configuration being disposed inside and outside an outer casing 201 that has, for example, a laterally long flat shape. The electronic apparatus 200 may be used as a gaming device, for example.

On a front face of the outer casing 201, a display panel 202 is disposed in the middle in a longitudinal direction. Moreover, disposed on the left and right of the display panel 202 are operation keys 203 and operation keys 204 that are spaced apart in a circumferential direction. Furthermore, operation keys 205 are disposed at a lower end on the front face of the outer casing 201. The operation keys 203, 204, or 205 function as an arrow key or an enter key, which is used to select a menu item displayed on the display panel 202, advance a game, etc.

Moreover, disposed on a top face of the outer casing 201 are a connection terminal 206 for coupling an external device, a power supply terminal 207 for supplying electric power, a light receiving window 208 for performing infrared communication with the external device, and so forth.

3.2. Example Configuration of Electronic Apparatus

Next, an internal configuration of the electronic apparatus 200 is described with reference to FIG. 7. FIG. 7 is a block diagram illustrating the internal configuration of the electronic apparatus 200.

As illustrated in FIG. 7, the electronic apparatus 200 includes: an arithmetic processor 210 that includes CPU (Central Processing Unit); a storage 220 that stores therein various pieces of information; and a controller 230 that controls each configuration of the electronic apparatus 200. The arithmetic processor 210 and the controller 230 are supplied with electric power from, for example, an unillustrated battery, etc.

The arithmetic processor 210 generates a menu screen for allowing a user to set various pieces of information or select an application. Moreover, the arithmetic processor 210 executes the application selected by the user.

The storage 220 retains various pieces of information set by the user. The storage 220 includes the magnetic storage element according to the present embodiment or the magnetic storage device.

The controller 230 includes an input receiver 231, a communication processor 233, and a power controller 235. The input receiver 231 detects conditions of, for example, the operation keys 203, 204, and 205. Moreover, the communication processor 233 performs a communication process with the external device. Furthermore, the power controller 235 controls the electric power supplied to each section of the electronic apparatus 200.

The magnetic storage element according to the present embodiment allows the storage 220 to operate with lower power consumption. Hence, the electronic apparatus 200 using the magnetic storage element according to the present embodiment or the magnetic storage device makes it possible to operate with lower power consumption.

Although preferred embodiments of the present disclosure have been described in detail hereinabove with reference to accompanying drawings, a technical scope of the present disclosure is not limited to those examples. It is apparent that those having ordinary skill in the art of the present disclosure would arrive at various alterations or modifications within a technical idea set forth in the appended claims, and it is understood that they naturally fall within the technical scope of the present disclosure.

Moreover, the effects described herein are merely illustrative or exemplary and not intended to be limiting. That is, in addition to or alternatively to the above-described effects, a technique according to the present disclosure may have other effects apparent to those skilled in the art from the description of the present specification.

It is to be noted that such configurations as described below also fall within the technical scope of the present disclosure.

(1)
A magnetic storage element including:
a spin orbit layer extending in one direction;
a writing line that is electrically coupled to the spin orbit layer, and allows a current to flow in an extending direction of the spin orbit layer;
a tunnel junction element including a storage layer, an insulator layer, and a magnetization fixed layer that are stacked in order on the spin orbit layer; and
a non-magnetic layer having a film thickness of 2 nm or less, and disposed at any stack position between the spin orbit layer and the insulator layer.

(2)
The magnetic storage element according to (1), in which the storage layer includes a first storage layer and a second storage layer, and
the non-magnetic layer is interposed between the first storage layer and the second storage layer.

(3)
The magnetic storage element according to (2), in which the first storage layer and the second storage layer are magnetically coupled to each other through the non-magnetic layer.

(4)
The magnetic storage element according to (2) or (3), in which the non-magnetic layer is further provided below the second storage layer.

(5)
The magnetic storage element according to any one of (2) to (4), further including a perpendicular assist layer that is provided between the spin orbit layer and the second storage layer and includes a compound having an NaCl-based crystal structure.

(6)
The magnetic storage element according to (1), in which a perpendicular assist layer, the non-magnetic layer, and the storage layer are stacked in order on the spin orbit layer, and the perpendicular assist layer includes a compound having an NaCl-based crystal structure.

(7)
The magnetic storage element according to any one of (1) to (6), in which the storage layer includes a magnetic material having a composition in which a plurality of elements is combined, and the plurality of elements is selected from the group consisting of Co, Fe, B, Al, Si, Mn, Ga, Ge, Ni, Cr, and V.

(8)
The magnetic storage element according to any one of (1) to (7), in which the non-magnetic layer includes a single layer film or a laminated film including one or more non-magnetic materials selected from the group consisting of Ru, Mo, Nb, HfB, Ta, W, Cr, MgO, AlO$_x$, MgS, and MgCaS$_2$.

(9)
An electronic apparatus including:
a storage that uses a magnetic storage element; and
an arithmetic processor that processes information on a basis of information stored in the storage,
the magnetic storage element including
a spin orbit layer extending in one direction,
a writing line that is electrically coupled to the spin orbit layer, and allows a current to flow in an extending direction of the spin orbit layer,
a tunnel junction element including a storage layer, an insulator layer, and a magnetization fixed layer that are stacked in order on the spin orbit layer, and
a non-magnetic layer having a film thickness of 2 nm or less, and disposed at any stack position between the spin orbit layer and the insulator layer.

DESCRIPTION OF THE REFERENCE NUMERALS

10, 11, 12, 13 Tunnel junction element
20 Spin orbit layer
21, 41 Electrode
30 Writing line
40 Reading line
110 Storage layer
111 First storage layer
112 Second storage layer
120 Non-magnetic layer
121 First non-magnetic layer
122 Second non-magnetic layer
130 Insulator layer
140 Magnetization fixed layer
150 Perpendicular assist layer

The invention claimed is:
1. A magnetic storage element, comprising:
a spin orbit layer that extends in a specific direction;
a writing line electrically coupled to the spin orbit layer, wherein the writing line is configured to allow current to flow in the specific direction of the spin orbit layer; and
a tunnel junction element including:
a first non-magnetic layer in direct contact with the spin orbit layer, wherein
the first non-magnetic layer comprises one of a single layer film or a laminated film, and
the one of the single layer film or the laminated film includes at least one non-magnetic material selected from the group consisting of Ru, Mo, Nb, HfB, Cr, MgO, AlO$_x$, MgS, and MgCaS$_2$;
a first storage layer in direct contact with the first non-magnetic layer;
a second non-magnetic layer in direct contact with the first storage layer;
a second storage layer;
an insulator layer; and
a magnetization fixed layer, wherein
the second storage layer, the insulator layer, and the magnetization fixed layer are stacked in order on the second non-magnetic layer, and each of the first non-magnetic layer and the second non-magnetic layer has a film thickness one of less than or equal to 2 nm.

2. The magnetic storage element according to claim 1, wherein the second non-magnetic layer is between the first storage layer and the second storage layer.

3. The magnetic storage element according to claim 2, wherein the first storage layer and the second storage layer are magnetically coupled to each other through the second non-magnetic layer.

4. The magnetic storage element according to claim 2, wherein the second non-magnetic layer is further below the second storage layer.

5. The magnetic storage element according to claim 1, wherein
the first storage layer includes a magnetic material having a composition in which a plurality of elements is combined, and
the plurality of elements being selected from the group consisting of Co, Fe, B, Al, Si, Mn, Ga, Ge, Ni, Cr, and V.

6. An electronic apparatus, comprising:
a storage that uses a magnetic storage element; and
an arithmetic processor configured to process information based on information stored in the storage, wherein the magnetic storage element includes:
a spin orbit layer that extends in a specific direction;
a writing line electrically coupled to the spin orbit layer, wherein the writing line is configured to allow current to flow in the specific direction of the spin orbit layer; and
a tunnel junction element including:
a first non-magnetic layer in direct contact with the spin orbit layer, wherein
the first non-magnetic layer comprises one of a single layer film or a laminated film, and
the one of the single layer film or the laminated film includes at least one non-magnetic material selected from the group consisting of Ru, Mo, Nb, HfB, Cr, MgO, $AlO_x$, MgS, and $MgCaS_2$;
a first storage layer in direct contact with the first non-magnetic layer;
a second non-magnetic layer in direct contact with the first storage layer;
a second storage layer;
an insulator layer; and
a magnetization fixed layer, wherein
the second storage layer, the insulator layer, and the magnetization fixed layer are stacked in order on the second non-magnetic layer, and
each of the first non-magnetic layer and the second non-magnetic layer has a film thickness one of less than or equal to 2 nm.

\* \* \* \* \*